(12) United States Patent
Porter et al.

(10) Patent No.: US 11,328,885 B2
(45) Date of Patent: May 10, 2022

(54) LOW ENERGY RECLOSING PULSE TEST

(71) Applicant: S&C Electric Company, Chicago, IL (US)

(72) Inventors: David G Porter, East Troy, WI (US); Stephen E Williams, Caledonia, WI (US); Peter J Meyer, Evanston, IL (US); Martin T Bishop, Oak Creek, WI (US); Thomas J Dyer, Minneola, FL (US); Andrew B Berman, Racine, WI (US); Joseph W Milton, Milwaukee, WI (US); Lauren Abramczyk, Cudahy, WI (US)

(73) Assignee: S&C Electric Company, Chicago, IL (US)

( * ) Notice: Subject to any disclaimer, the term of this patent is extended or adjusted under 35 U.S.C. 154(b) by 58 days.

(21) Appl. No.: 17/109,015

(22) Filed: Dec. 1, 2020

(65) Prior Publication Data

US 2021/0175033 A1   Jun. 10, 2021

Related U.S. Application Data

(60) Provisional application No. 62/944,296, filed on Dec. 5, 2019.

(51) Int. Cl.
  *H01H 33/666*  (2006.01)
  *H01H 36/00*   (2006.01)
  *G01R 31/327*  (2006.01)

(52) U.S. Cl.
  CPC ..... *H01H 33/6662* (2013.01); *G01R 31/3271* (2013.01); *G01R 31/3278* (2013.01); *H01H 36/00* (2013.01)

(58) Field of Classification Search
  CPC ............ G01R 31/3271; G01R 31/3278; G01R 31/3272; G01R 31/327; G01R 31/333;
  (Continued)

(56) References Cited

U.S. PATENT DOCUMENTS

| | | | | |
|---|---|---|---|---|
| 5,452,172 A | * | 9/1995 | Lane | H02H 1/06 361/72 |
| 6,580,947 B1 | * | 6/2003 | Thompson | A61N 1/37211 607/30 |

(Continued)

FOREIGN PATENT DOCUMENTS

| | | | | |
|---|---|---|---|---|
| CA | 2395661 A1 | * | 7/2001 | ......... H02B 13/0354 |
| CN | 102084568 A | * | 6/2011 | ............. H01H 75/04 |

(Continued)

OTHER PUBLICATIONS

PCT/US2020/062726 International Search Report and Written Opinon, dated Feb. 2021. (Year: 2021).*

(Continued)

*Primary Examiner* — Patrick Assouad
*Assistant Examiner* — Sean Curtis

(57) ABSTRACT

A method for performing a low energy pulse testing in a power distribution network that causes contacts to close and then open in about one fundamental frequency cycle of current flow time and close on a voltage waveform that produces symmetrical fault current. The method includes energizing a magnetic actuator to move the actuator against the bias of a spring to move a movable contact towards a fixed contact. The method also includes de-energizing the actuator when the movable contact makes contact with the fixed contact so as to allow the spring to move the movable contact away from the fixed contact so that the amount of time that the current conducts is about one fundamental frequency cycle of the current, where energizing the magnetic actuator occurs when an applied voltage on the switch assembly is at a peak of the voltage wave so that the current is symmetric.

20 Claims, 3 Drawing Sheets

(58) Field of Classification Search
CPC ........... G01R 31/3333; H01H 33/6662; H01H 36/00; H01H 81/00; H02H 3/06; H02H 3/066; H02H 7/008
USPC ......................................................... 324/424
See application file for complete search history.

(56) References Cited

U.S. PATENT DOCUMENTS

| | | | | |
|---|---|---|---|---|
| 6,911,610 | B2* | 6/2005 | Gemme | H02H 1/06 335/229 |
| 7,432,788 | B2* | 10/2008 | Glukh | H01H 36/00 335/78 |
| 10,600,593 | B2* | 3/2020 | Falkingham | H01H 33/6662 |
| 2004/0263297 | A1* | 12/2004 | Glukh | H01H 1/0036 335/207 |
| 2008/0266733 | A1* | 10/2008 | O'Leary | H01H 75/04 361/71 |
| 2015/0332880 | A1* | 11/2015 | Falkingham | H01H 9/20 218/142 |
| 2019/0252139 | A1* | 8/2019 | Falkingham | H01H 33/12 |
| 2019/0304721 | A1* | 10/2019 | Falkingham | H01H 9/20 |
| 2020/0244059 | A1* | 7/2020 | Lellis Junior | H01H 47/226 |
| 2020/0251294 | A1* | 8/2020 | Rusev | H01H 33/6662 |
| 2020/0411261 | A1* | 12/2020 | Zhou | H01H 33/285 |
| 2021/0175033 | A1* | 6/2021 | Porter | G01R 31/3271 |
| 2022/0020546 | A1* | 1/2022 | Delbaere | H01H 47/002 |
| 2022/0076912 | A1* | 3/2022 | Mittelstadt | H01H 50/18 |
| 2022/0082594 | A1* | 3/2022 | Clarke | G01R 19/16523 |

FOREIGN PATENT DOCUMENTS

| | | | | | |
|---|---|---|---|---|---|
| EP | 1214727 | B1 | * | 9/2004 | ......... H01H 33/6662 |
| EP | 1639612 | B1 | * | 2/2007 | ........... H01H 1/0036 |
| EP | 3675147 | A1 | | 7/2020 | ........... G01R 15/181 |
| KR | 20010030619 | A | * | 4/2001 | ......... H01H 33/6662 |
| KR | 100668923 | B1 | * | 1/2007 | ............... H01H 3/28 |
| KR | 20070120628 | A | * | 12/2007 | ............. H01H 33/38 |
| KR | 100809902 | B1 | * | 3/2008 | ......... H02B 13/0354 |
| WO | WO-0109912 | A2 | * | 2/2001 | ......... H01H 33/6662 |
| WO | WO-2005006365 | A1 | * | 1/2005 | ........... H01H 1/0036 |
| WO | WO-2006069957 | A1 | * | 7/2006 | ........... H01H 1/0015 |
| WO | WO-2006069970 | A1 | * | 7/2006 | ........... H01H 1/0015 |
| WO | WO-2015114375 | A1 | * | 8/2015 | ............. H01H 33/38 |
| WO | WO-2020093132 | A1 | * | 5/2020 | ............... H01F 7/13 |
| WO | WO-2020131908 | A1 | * | 6/2020 | ........... G01R 31/086 |
| WO | WO-2021047795 | A1 | * | 3/2021 | ......... H01H 33/6662 |
| WO | WO-2021113252 | A1 | * | 6/2021 | ......... G01R 31/3278 |

OTHER PUBLICATIONS

International Search Report and Written Opinion for International Application No. PCT/US2020/062726 dated Feb. 19, 2020. (10 pages).

* cited by examiner

LOW ENERGY RECLOSING PULSE TEST

CROSS-REFERENCE TO RELATED APPLICATION

This application claims the benefit of priority from the U.S. Provisional Application No. 62/944,296, filed on Dec. 5, 2019, the disclosure of which is hereby expressly incorporated herein by reference for all purposes.

BACKGROUND

Field

The present disclosure relates generally to a system and method for performing a low energy pulse testing operation in a power distribution network to determine if a fault condition is present.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down by transformers to a medium voltage for distribution. The substations provide the medium voltage power to a number of three-phase feeders including three single-phase feeder lines that provide medium voltage to various distribution transformers and lateral line connections. A number of three-phase and single-phase lateral lines are tapped off of the feeder that provide the medium voltage to various distribution transformers, where the voltage is stepped down to a low voltage and is provided to a number of loads, such as homes, businesses, etc.

Power distribution networks of the type referred to above typically include a number of switching devices, breakers, reclosers, interrupters, etc. that control the flow of power throughout the network. A vacuum interrupter is a switch that has particular application for many of these types of devices. A vacuum interrupter employs opposing contacts, one fixed and one movable, positioned within a vacuum enclosure. When the interrupter is opened by moving the movable contact away from the fixed contact the arc that is created between the contacts is quickly extinguished as the AC current goes through zero in the vacuum. A vapor shield is typically provided around the contacts to contain the by-products of the arcing. For certain applications, the vacuum interrupter is encapsulated in a solid insulation housing that may have a grounded external surface.

Periodically, faults occur in the distribution network as a result of various things, such as animals touching the lines, lightning strikes, tree branches falling on the lines, vehicle collisions with utility poles, etc. Faults may create a short-circuit that increases the stress on the network, which may cause the current flow from the substation to significantly increase, for example, many times above the normal current, along the fault path. This amount of current causes the electrical lines to significantly heat up and possibly melt, and also could cause mechanical damage to various components in the substation and in the network. These faults are many times transient or intermittent faults as opposed to a persistent or bolted fault, where the thing that caused the fault is removed a short time after the fault occurs, for example, a lightning strike. In such cases, the distribution network will almost immediately begin operating normally after a brief disconnection from the source of power.

Fault interrupters, for example, reclosers that employ vacuum interrupters, are provided on utility poles and in underground circuits along a power line and have a switch to allow or prevent power flow downstream of the recloser. These reclosers detect the current and voltage on the line to monitor current flow and have controls that indicate problems with the network circuit, such as detecting a high current fault event. If such a high fault current is detected the recloser is opened in response thereto, and then after a short delay closed to determine whether the fault is a transient fault. If a high fault current flows when the recloser is closed after opening, it is immediately re-opened. If the fault current is detected a second time, or multiple times, during subsequent opening and closing operations indicating a persistent fault, then the recloser remains open, where the time between detection tests may increase after each test. For a typical reclosing operation for fault detection tests, about 3-6 cycles or 50 to 100 ms of fault current pass through the recloser before it is opened, but testing on delayed curves can allow fault current to flow for much longer times.

When a fault is detected, it is desirable that the first fault interrupter upstream from the fault be opened as soon as possible so that the fault is quickly removed from the network so that the loads upstream of that fault interrupter are not disconnected from the power source and service is not interrupted to them. It is further desirable that if the first fault interrupter upstream from the fault does not open for whatever reason, then a next fault interrupter upstream from the fault is opened, and so on. In order to accomplish this, it is necessary that some type of communications or coordination protection scheme be employed in the network so that the desired fault interrupter is opened in response to the fault.

During the traditional reclosing operation discussed above, the vacuum interrupter contacts in the recloser are closed without regard to a desired phase angle. This results in a random closing angle that often creates an asymmetrical fault current, where the current cycle is offset from zero, i.e., has high magnitude peaks in one polarity and lower peaks in the reverse polarity relative to zero. The high magnitude fault current peaks, depending on the length of time they are occurring, causes significant forces and stresses on the components in the network that may reduce their life. For the traditional reclosing operation having current flow times over 3-6 cycles and longer times for delayed curve operation, these forces and stresses can be considerable. When considering the life of a transformer winding, one cause of end of life can be fatigue in the winding, which is the accumulation of high mechanical and thermal stress cycles. Stress is the result of the current in the winding, where higher current results in higher stress. Doubling the stress that can cause fatigue from the asymmetrical fault currents described above can result in a tenfold or more reduction in fatigue life, i.e., the life before fatigue causes cracking. This stress can be reduced by reducing the peak current and by reducing the number of stress cycles.

In order to overcome this problem, reclosers have been developed in the art that use pulse testing technologies where the closing and then opening of the vacuum interrupter contacts is performed in a pulsed manner so that the full fundamental frequency multiple cycle fault current is not applied to the network while the recloser is testing to determine if the fault is still present. Typically these pulses are about one-half of a fundamental frequency current cycle. Additionally, these reclosers close at the appropriate point on the voltage waveform to eliminate the asymmetrical current, which reduces the stresses due to high current in the components.

Pulse closing technologies have been successful in significantly reducing fault current stresses on network equipment during recloser testing. However, the switching devices required to generate these short pulse durations are relatively complicated and expensive. For example, vacuum interrupters employed to generate these pulses often use two magnetic actuators, one to close the contacts and one to quickly open the contacts using the moving mass of the opening actuator to reverse the direction of the closing actuator, well understood by those skilled in the art.

SUMMARY

The following discussion discloses and describes a system and method for performing a low energy pulse testing operation in a power distribution network that causes recloser contacts to close and then open in such a way that produces current flow for one fundamental frequency cycle after closing on a voltage waveform that produces symmetrical current. The method includes energizing a magnetic actuator to move the movable contact towards the fixed contact, where AC current conducts across a gap between the movable contact and the fixed contact before the movable contact and the fixed contact make contact. The actuator movement to close the contacts pushes against the bias of at least one opening spring coupled to the movable contact. A compliance spring coupled to the movable contact with some preload is compressed further as the two contacts touch. The method also includes de-energizing the magnetic actuator or reversing the voltage on the magnetic actuator when the movable contact makes contact with the fixed contact so as to allow the bias of the opening and compliance springs to first compress absorbing energy from the motion of the moving mass, then to expand moving the movable contact away from the fixed contact so that the amount of time that the current conducts between the movable contact and the fixed contact is about one fundamental frequency cycle, and where energizing the magnetic actuator occurs at a time at or near a peak of the voltage wave so that the current through the switch assembly is symmetric.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a system and method for performing a low energy fault pulse testing operation in a power distribution network that causes recloser contacts to close and then open in approximately one fundamental frequency cycle of current flow time and close on a voltage waveform that produces symmetrical fault current is merely exemplary in nature, and is in no way intended to limit the invention or its applications or uses.

The present disclosure proposes a system and method that replaces the known fault pulse testing process in a power distribution network with a low energy fault pulse testing process, which results in lower cost switching devices. The method includes controlling the position of the switch contacts in a recloser so that they conduct for a short time duration that limits the current conduction time to one fundamental frequency cycle. The method also includes closing the switch contacts at a point on the voltage waveform that results in the flow of symmetrical current instead of asymmetrical current, which is accomplished by recognizing that asymmetrical currents occur from closing the contacts at a certain voltage angle, where the preferred angle for asymmetrical current is at or near the peak of the voltage waveform. The disclosed low energy testing process is distinguished from the conventional recloser random closing operation since the recloser protection functions perform their normal fault detection processes, thereby extending the potential fault duration to several power system cycles or a much longer time.

Figure 1:
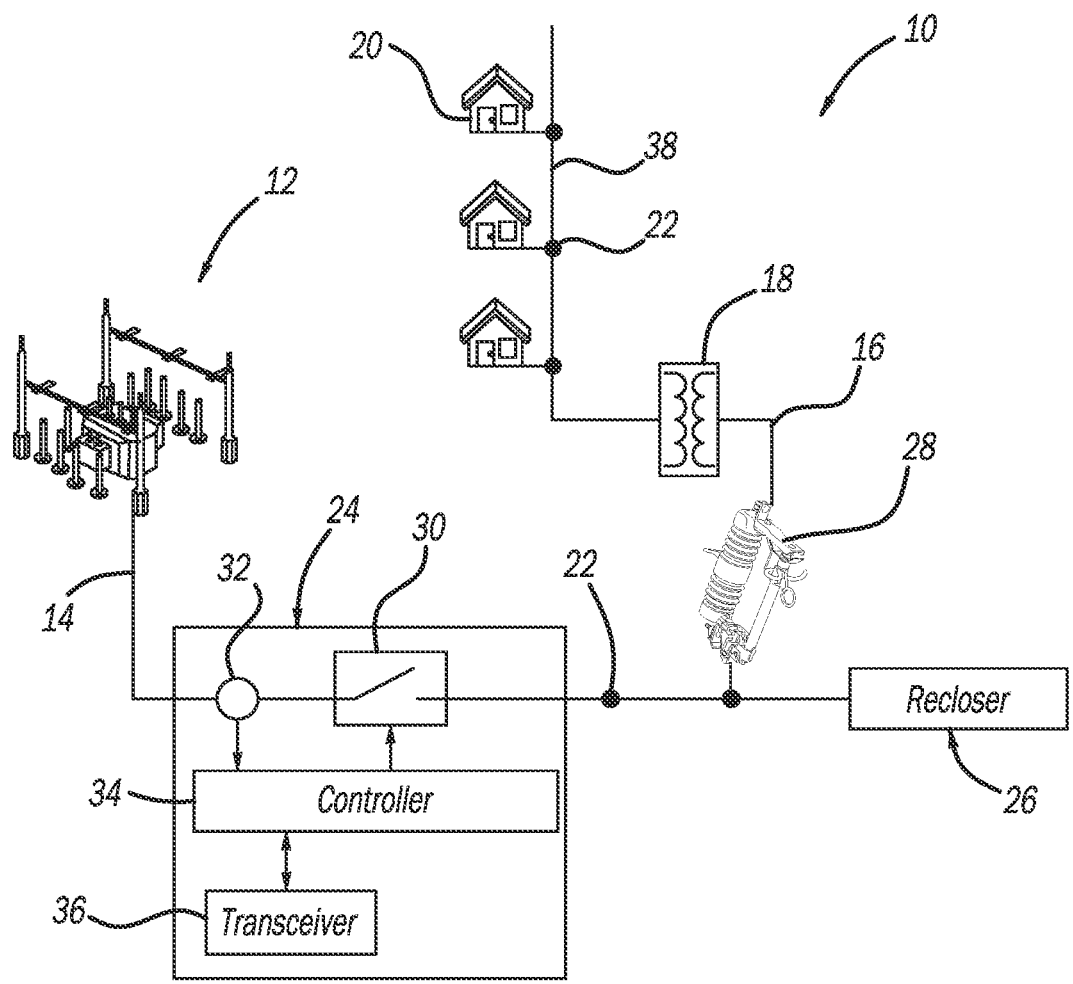
FIG. 1 is a simplified schematic illustration of an electrical power distribution network.

FIG. 1 is a schematic type diagram of an electrical power distribution network 10 including an electrical substation 12 that steps down high voltage power from a high voltage power line (not shown) to medium voltage power, a three-phase feeder 14 that receives medium voltage power from the substation 12, and a lateral line 16 that receives the medium voltage power from the feeder 14. The medium voltage is stepped down to a low voltage by a number of distribution transformers 18 strategically positioned along the lateral line 16, and the low voltage is then provided through a secondary service conductor 38 to a number of loads 20 represented here as homes. The lateral line 16 includes a fuse 28 positioned between the feeder 14 and the first load 20 on the lateral line 16 proximate to a tap location where the lateral line 16 is connected to the feeder 14. The fuse 28 is an independent electrical device that is not in communication with other components or devices in the network 10, where the fuse 28 creates an open circuit if an element within the fuse 28 heats up above a predetermined temperature as a result of high fault current so as to prevent short-circuit faults on the lateral line 16 from affecting other parts of the network 10.

The network 10 includes a number of reclosers of the type referred to above provided at certain intervals along the feeder 14 represented by reclosers 24 and 26 that receive the medium voltage from the substation 12 on the feeder 14. Although only shown as a single line, the feeder 14 would include three lines, one for each phase, where a three-phase or three separate reclosers would be provided in each line. A number of utility poles 22 are provided along the feeder 14 and the lateral line 16, where the recloser 24 would be mounted on certain ones of the poles 22. The recloser 24 includes a vacuum interrupter switch or other switching device 30 for opening and closing the recloser 24 to allow or prevent current flow therethrough on the feeder 14, where the switch 30 is capable of providing pulses for pulse testing consistent with the discussion herein. The recloser 24 also includes sensors 32 for measuring the current and voltage of the power signal propagating on the feeder 14, an electronic controller 34 for processing the measurement signals and controlling the position of the switch 30, and an optional transceiver 36 for transmitting data and messages to a control facility and/or to other reclosers and components in the system 10. The configuration and operation of reclosers and switching devices of this type are well understood by those skilled in the art.

Figure 2:
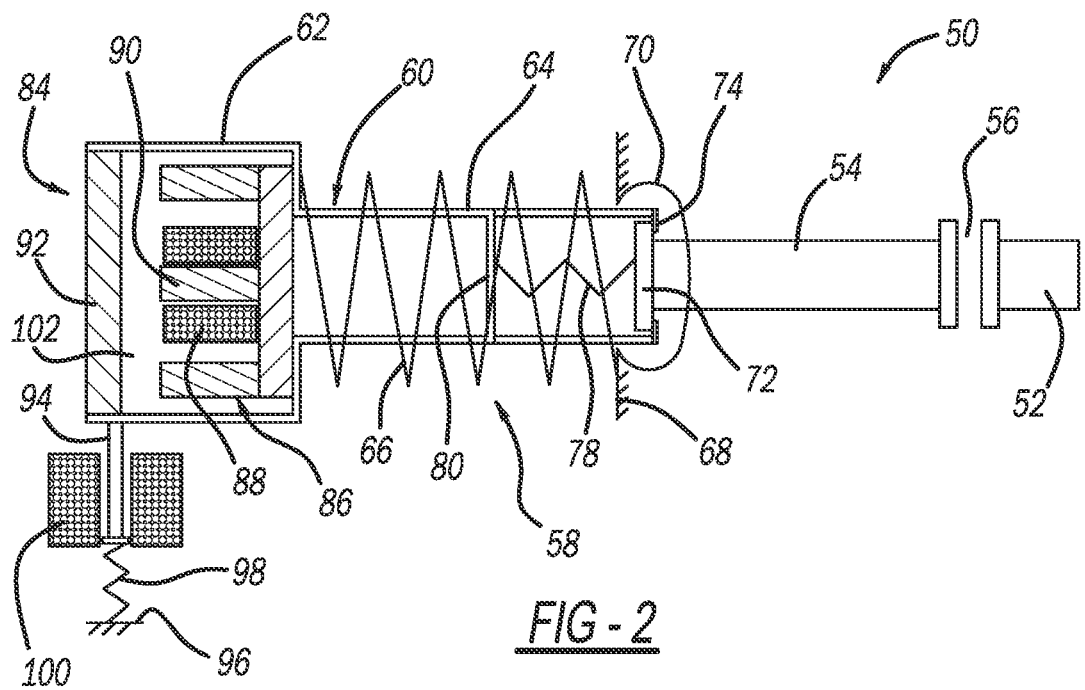
FIG. 2 is a side, cross-sectional type view of a magnetic actuator switch assembly in an open position that can be used in a recloser in the power distribution network shown in FIG. 1.
Figure 3:
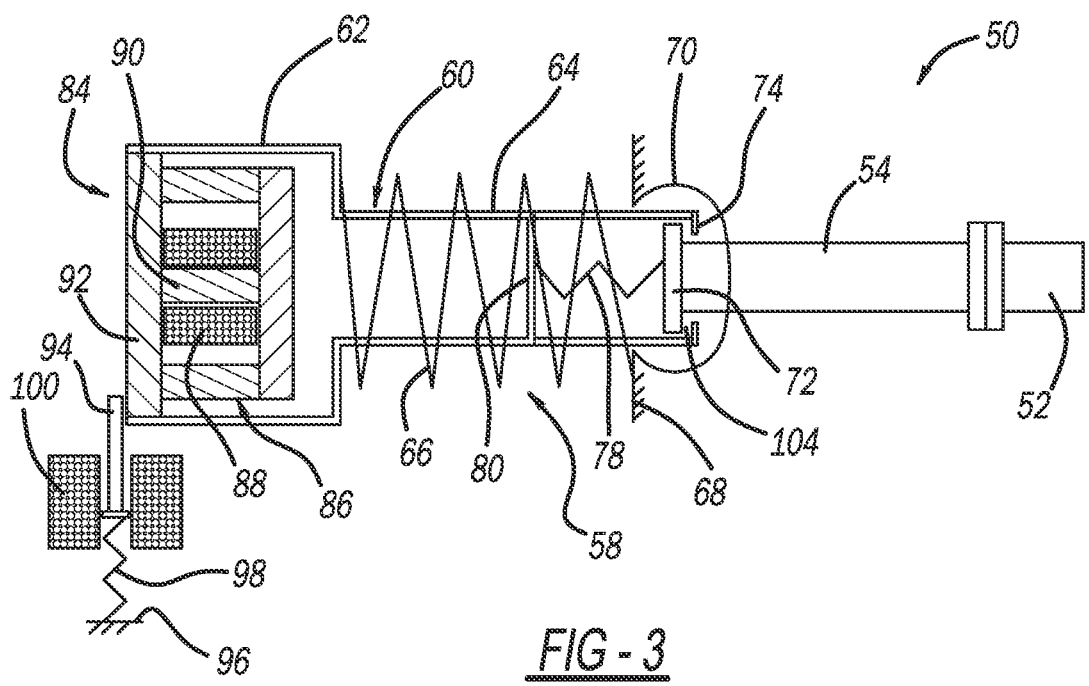
FIG. 3 is a side, cross-sectional type view of the magnetic actuator switch assembly shown in FIG. 2 in a closed position.

FIG. 2 is a side, cross-sectional type view of a magnetic actuator switch assembly 50 in an open position and FIG. 3 is a side, cross-sectional type view of the switch assembly 50 in a closed position, where the switch assembly 50 can be used in the switch 30. The switch assembly 50 includes a fixed contact 52 and a movable contact 54 having a defined mass, for example, 0.4 kg, that would be positioned in, for example, a vacuum bottle of a vacuum interrupter, where the contacts 52 and 54 are shown spaced apart from each other across a vacuum gap 56 in the open position, and where the distance of the gap 56 is determined so as to prevent conduction between the contacts 52 and 54 in the open position based on the voltages employed in the network 10. The switch assembly 50 further includes an actuator 58 having an actuator housing 60 with a wide housing portion 62 and a narrow housing portion 64. An open spring 66 is wound around the narrow housing portion 64 and is positioned against the wide housing portion 62 and a conductive structure 68, where the current path on the power line flows through a current transfer coupling 70 coupled to the structure 68 and the movable contact 54. A flange 72 attached to the movable contact 54 opposite from the gap 56 is positioned within the narrow housing portion 64 and engages a flange 74 at an end of the narrow housing portion 64 opposite to the wide housing portion 62. A compliance spring 78 is positioned in the narrow housing portion 64 against the flange 72 and a wall 80, where the spring 78 has, in one non-limiting embodiment, a 266 Newton preload and a 334 Newton full deflection. The actuator 58 further includes a solenoid 84 positioned within the wide housing portion 62 and including a core 86, a coil 88 wrapped around a center portion 90 of the core 86 and movable core 92 attached to the housing 60, where a gap 102 is provided between the movable core 92 and the core 86 when the contacts 52 and 54 are open. The core 86 is an E-shaped core in this non-limiting embodiment, where other shaped cores may be applicable such as round pot cores. A plunger 94 is secured to a fixed member 96 by a spring 98 and having a coil 100 wrapped around it.

To close the contacts 52 and 54, the coil 88 is energized so that magnetic flux across the gap 102 between the magnetic elements draws the movable core 92 towards the E-shaped core 86, which moves the housing 60 against the bias of the open spring 66 and causes the compliance spring 78 to push the movable contact 54 against the fixed contact 52, where the bias of the springs 66 and 78 hold the contacts 52 and 54 together in a tight engagement. The coil 100 is de-energized which causes the spring 98 to move the plunger 94 upwards and hold the actuator 58 in the closed position. To open the contacts 52 and 54, the coil 100 is energized to pull the plunger 94 downward against the friction of the moving part of the actuator 58 and the bias of the spring 98 so that the open spring 66 and the compliance spring 78 push the housing 60 to the left and moves the movable core 92 away from the E-shaped core 86. Since it is necessary to quickly open the contacts 52 and 54 when fault current is detected, the spring forces used to move the contact 54 away from the contact 52 are relatively high. Additionally, it is desirable to coordinate the opening of the contacts 52 and 54 with other reclosers so that those reclosers closest to the fault are opened first, which requires a force to be applied to the movable contact 54 to hold the contacts 52 and 54 closed for some period of time when a fault is detected to coordinate with faster reclosers.

Figure 4:
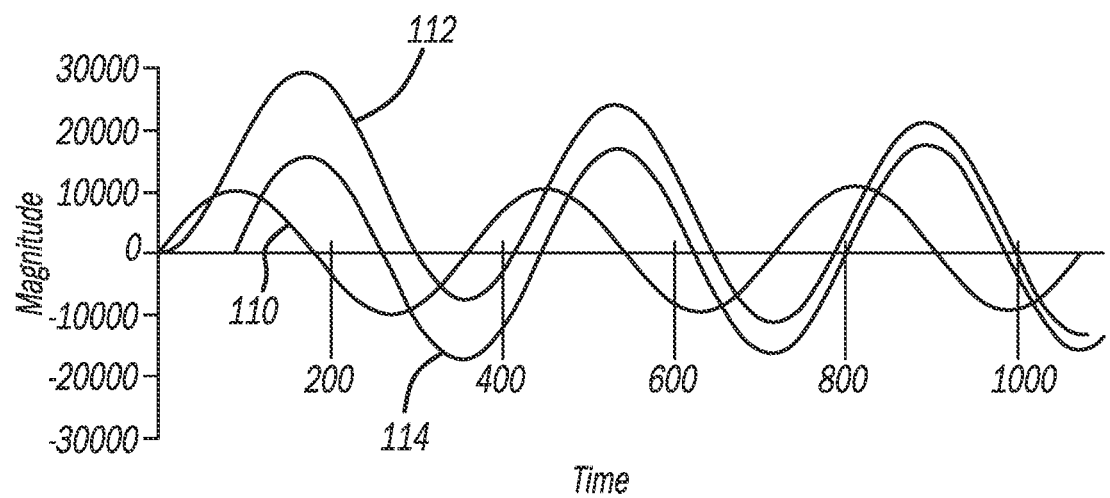
FIG. 4 is a graph with time on the horizontal axis and magnitude on the vertical axis showing a relationship between symmetrical and asymmetrical current relative to voltage angle.
Figure 5:
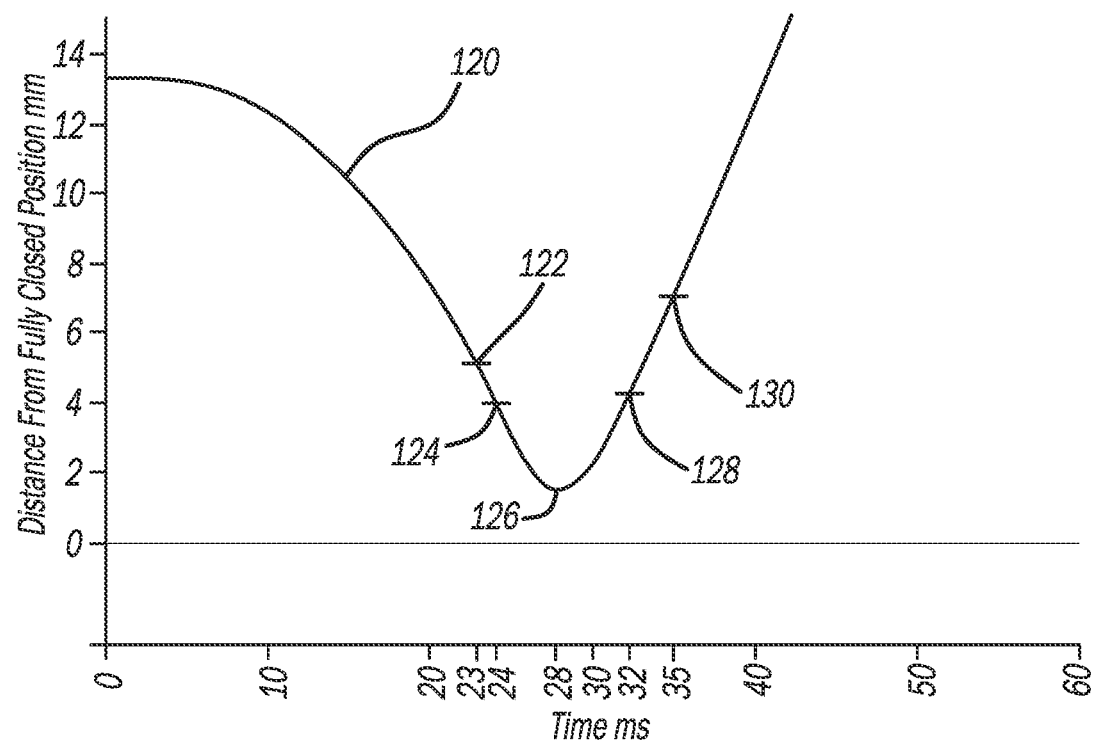
FIG. 5 is a graph with time on the horizontal axis and actuator housing position on the vertical axis showing position versus time of the actuator housing in the switch assembly.

As mentioned above, this disclosure describes a low energy fault pulse testing process that causes about one fundamental frequency cycle of symmetrical current during each pulse test. Process algorithms control the switch assembly 50 to provide point-on-wave closing of the contacts 52 and 54 to obtain the short duration symmetric current flow that includes controlling the relative position of the vacuum interrupter contacts 52 and 54 to provide the desired time to start and end current conduction across the contacts 52 and 54 by controlling the time when the actuator 58 begins moving to close the contacts 52 and 54 and controlling when the coil 88 is turned off. FIGS. 4 and 5 are graphs to help illustrate the control of the switch assembly 50 in this manner.

FIG. 4 is a graph with time on the horizontal axis and magnitude on the vertical axis showing a relationship between symmetrical and asymmetrical current relative to a voltage waveform. Graph line 110 is the measured voltage at the switch assembly 50 during the fault and shows the zero cross-overs of the voltage signal. Graph line 112 shows the measured fault current at the switch assembly 50 if the contacts 52 and 54 begin conduction at a zero cross-over of the voltage, and shows the current being offset or asymmetrical where the positive peaks are much higher in absolute magnitude than the negative peaks, which leads to significant stress on the electrical components in the network 10 that are subjected to the fault current because of the high current magnitude. Graph line 114 shows the measured fault current if the contacts 52 and 54 begin conducting at a voltage angle 90°, and shows the current being symmetrical where the positive and negative peak values are at the same magnitude relative to zero. Thus, although the peak-to-peak current is the same for symmetrical and asymmetrical currents, the absolute magnitude of the peaks is less for symmetrical current, which reduces the stress on the electrical components in the network 10 that are subjected to the fault current.

FIG. 5 is a graph with time on the horizontal axis and the position of the actuator housing 60 on the vertical axis, where graph line 120 shows the position of the actuator housing 60 from when it starts moving to close the contacts 52 and 54 until it returns to the contact open position. The zero position is the position of the actuator housing 60 where the movable core 92 is touching the E-shaped core 86, as shown in FIG. 3. When the coil 88 is energized and the actuator housing 60 moves to close the contacts 52 and 54, initially compressing the springs 66 as the movable contact 54 is moved towards the fixed contact 52, the gap 56 will be reduced. When the position of the actuator housing 60 is at about 5 mm shown by point 122 at about time 23 ms, the gap 56 is about 1 mm, and conduction between the contacts 52 and 54 will begin across the gap 56, known as a pre-strike. As the actuator housing 60 continues to move, the contacts 52 and 54 will engage at actuator position of about 4 mm shown by point 124 at about time 24 ms, and the current to the coil 88 will be shut off. The momentum of the actuator housing 60 will continue moving the actuator housing 60 until the position of the actuator housing 60 is about 1.5 mm at point 126 at about time 28 ms, shown as a gap 104 between the flanges 72 and 74 in FIG. 3, when the compression forces of the springs 66 and 78 are holding the contacts 52 and 54 closed and the actuator housing 60 will reverse its direction. At point 128, about time 32 ms, the contacts 52 and 54 will separate, but there still is conduction across the gap 56 until the gap length is about 3 mm, which occurs at point 130 at about time 35 ms. One fundamental frequency cycle at 60 Hz is about 16.7 ms for 60 Hz, so the time from the beginning of the conduction at time 23 ms until the end of conduction at time 35 ms is 12 ms, which is about three-fourths of the cycle, where the current stops at the next zero current crossing. Thus, the current conduction time through the contacts 52 band 54 is one fundamental frequency cycle at 60 Hz. These times can be adjusted for systems that operate at other frequencies.

The control of the switch assembly 50 as being described includes driving the movable contact 54 into the fixed contact 52 and then immediately turning off the current applied to the coil 88, or reversing the voltage on the coil 88 to drive the coil current to zero, so that the closing force between the contacts 52 and 54 is only provided by the momentum of the actuator 58 and the mass of the movable contact 54 against the forces provided by the open spring 66 and the compliance spring 78, which bounces the movable contact 54 off of the fixed contact 52. In other words, the velocity of the actuator 58 after the coil 88 is turned off, or otherwise has zero coil current, compresses the compliance spring 78 until the stored energy in the moving mass of the actuator 58 and the movable contact 54 is transferred to the compliance spring 78, where the compliance spring 78 will push the contacts 52 and 54 back open again. Thus, by intentionally bouncing the contacts 52 and 54 for the low energy test in this manner, the potential fault current duration is limited to one fundamental frequency current cycle as described. Specifically, the control of the switch assembly 50 is capable of opening the vacuum interrupter contacts 52 and 54 fast enough to be able to interrupt current flow within 16.7 ms of the first conduction between the contacts 52 and 54, which gives a total conduction time from closing to opening the contacts 52 and 54 less than 16.7 ms as measured from a 1 mm open pre-strike contact gap to a 3 mm open contact gap. This results in one fundamental frequency current cycle of symmetrical fault current, which is twice the time that the present single pulse would allow as known pulse testing a faulted circuit results in a half-cycle of fault current. These times can be adjusted for systems that operate at other frequencies.

Thus, the switch assembly 50 is designed so that the moving mass of the actuator 58 and the movable contact 54, the size and length of the compliance spring 78, the amount of current applied to the coil 88, the time that the current is removed from the coil 88 during the closing operation, etc. cause the contacts 52 and 54 to conduct for about one fundamental frequency cycle of fault current. Since the control of the switch assembly 50 allows control of the position of the movable contact 54 relative to time, the timing of the conduction between the contacts 52 and 54 can be controlled so that current begins flowing at a 90° angle of the voltage waveform so that symmetrical currents flow instead of asymmetrical currents when the contacts 52 and 54 are closed, which reduces forces on the network components. Further, traditional vacuum interrupters can be employed instead of more complex and specialized vacuum interrupters required for the known pulse testing.

Another embodiment includes closing the vacuum interrupter contacts 52 and 54 at the voltage peak that drives transformers away from saturation, thereby keeping the transformers from saturating, where when a transformer is de-energized there is often a non-zero remnant flux in the transformer core. Energization in-rush current results from saturation of the transformer core when it is energized at a voltage point where the new flux drives the transformer into saturation. This can be reduced/eliminated by keeping a flux model of transformers in some form of memory, closing the vacuum interrupter contacts 52 and 54 so that the flux will move toward zero rather than away from zero. If the residual flux is the result of positive voltage the vacuum interrupter contacts 52 and 54 close when the voltage is negative moving the flux toward zero and minimizing the peak flux that drives the transformer core into saturation. The flux at peak voltage is zero because it lags the voltage by 90°. If this is the case, the point-on-wave can be adjusted to correct the residual flux by closing slightly earlier than the peak of the voltage waveform.

Many of the examples used in this discussion were derived for power systems operating at 60 Hz fundamental frequency. It is noted that similar techniques can be applied to adjust the mechanism to operate at other fundamental frequencies.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for operating a magnetically actuated switch assembly to perform a low energy test pulse, the switch assembly including a fixed contact and a movable contact, the method comprising:
    energizing a magnetic actuator to move the actuator against the bias of at least one spring coupled to the movable contact towards the fixed contact to make contact therebetween, wherein AC current conducts across a gap between the movable contact and the fixed contact before the movable contact and the fixed contact make contact; and
    de-energizing the magnetic actuator or reversing the voltage on the magnetic actuator when the movable contact makes contact with the fixed contact so as to allow the bias of the at least one spring to move the movable contact away from the fixed contact so that the amount of time that the current conducts between the movable contact and the fixed contact is about one fundamental frequency cycle of the current, wherein energizing the magnetic actuator occurs at a time so that when the movable contact and the fixed contact begin conducting an applied voltage on the switch assembly is at or near a peak of the voltage wave so that the current is symmetric.

2. The method according to claim 1 wherein the at least one spring is a larger open spring and a smaller compliance spring.

3. The method according to claim 2 wherein the open spring is wrapped around a cylindrical housing and the compliance spring is provided within the housing.

4. The method according to claim 3 wherein the magnetic actuator includes a stationary core having a coil and a movable core that moves towards the stationary core when the actuator is energized, and wherein de-energizing the magnetic actuator or reversing the voltage on the magnetic actuator includes include removing or reversing a voltage applied to the coil.

5. The method according to claim 1 wherein the one fundamental frequency cycle of current is about 16.7 ms for 60 Hz.

6. The method according to claim 5 wherein the time that the contacts begin conducting to the time the contacts will withstand voltage when the current goes to zero is about three-quarters of the one fundamental frequency cycle time.

7. The method according to claim 1 wherein the voltage on the switch assembly that is at or near the peak of the voltage wave is at a 90° voltage angle.

8. The method according to claim 1 wherein the contacts are part of a vacuum interrupter.

9. The method according to claim 8 wherein the current is a fault current in a medium voltage power distribution network and the vacuum interrupter is part of a recloser in the power distribution network.

10. A method for performing a reclosing fault testing operation in a power distribution network using a vacuum interrupter including a fixed contact and a movable contact, the method comprising:

energizing a magnetic actuator to move the actuator against the bias of at least one spring coupled to the movable contact towards the fixed contact to make contact therebetween, wherein AC fault current conducts across a gap between the movable contact and the fixed contact before the movable contact and the fixed contact make contact; and de-energizing the magnetic actuator or reversing the voltage on the magnetic actuator when the movable contact makes contact with the fixed contact so as to allow the bias of the at least one spring to move the movable contact away from the fixed contact so that the amount of time that the current conducts between the movable contact and the fixed contact is about one fundamental frequency cycle of the fault current.

11. The method according to claim 10 wherein the one fundamental frequency cycle of current is about 16.7 ms for 60 Hz.

12. The method according to claim 11 wherein the time that the contacts begin conducting to the time the contacts will withstand voltage when the current goes to zero is about three-quarters of the one fundamental frequency cycle time.

13. The method according to claim 10 wherein the at least one spring is a larger open spring and a smaller compliance spring.

14. A method for performing a low energy pulse testing operation in a power distribution network using a vacuum interrupter including a fixed contact and a movable contact, the method comprising:

energizing a magnetic actuator to move the actuator against the bias of at least one spring coupled to the movable contact towards the fixed contact to make contact therebetween, wherein AC fault current conducts across a gap between the movable contact and the fixed contact before the movable contact and the fixed contact make contact; and de-energizing the magnetic actuator or reversing the voltage on the magnetic actuator so as to allow the bias of the at least one spring to move the movable contact away from the fixed contact, wherein energizing the magnetic actuator occurs at a time so that when the movable contact and the fixed contact begin conducting an applied voltage on the switch assembly is at or near a peak of the voltage wave so that the fault current is symmetric.

15. The method according to claim 14 wherein the voltage on the switch assembly that is at or near the peak of the voltage wave is at a 90° voltage angle.

16. The method according to claim 14 wherein the at least one spring is a larger open spring and a smaller compliance spring.

17. A system for using a magnetically actuated switch assembly to produce a low energy pulse test, the switch assembly including a fixed contact and a movable contact, the system comprising:

means for energizing a magnetic actuator to move the actuator against the bias of at least one spring coupled to the movable contact towards the fixed contact to make contact therebetween, wherein AC current conducts across a gap between the movable contact and the fixed contact before the movable contact and the fixed contact make contact; and means for de-energizing the magnetic actuator or reversing the voltage on the magnetic actuator when the movable contact makes contact with the fixed contact so as to allow the bias of the at least one spring to move the movable contact away from the fixed contact so that the amount of time that the current conducts between the movable contact and the fixed contact is about one fundamental frequency cycle of the current, wherein energizing the magnetic actuator occurs at a time so that when the movable contact and the fixed contact begin conducting an applied voltage on the switch assembly is at or near a peak of the voltage wave so that the current is symmetric.

18. The system according to claim 17 wherein the one fundamental frequency cycle of current is about 16.7 ms for 60 Hz.

19. The system according to claim 18 wherein the time that the contacts begin conducting to the time the contacts will withstand voltage when the current goes to zero is about three-quarters of the one fundamental frequency cycle time.

20. The method according to claim 17 wherein the voltage on the switch assembly that is at or near the peak of the voltage wave is at a 90° voltage angle.

* * * * *